United States Patent [19]
Kelley et al.

[11] Patent Number: 5,841,521
[45] Date of Patent: Nov. 24, 1998

[54] METHOD AND APPARATUS FOR OBTAINING A LITHOGRAPHIC PLATE

[75] Inventors: Henry A. Kelley, Woburn, Mass.; Jos Alfons Vaes; Johan Hubert Van Hunsel, both of Mortsel, Belgium

[73] Assignee: Agfa Division, Bayer Corporation, Wilmington, Mass.

[21] Appl. No.: 449,458

[22] Filed: May 24, 1995

Related U.S. Application Data

[62] Division of Ser. No. 373,664, Jan. 17, 1995, Pat. No. 5,616,445.

[51] Int. Cl.$^6$ .............................. B41N 1/00; G03B 27/54
[52] U.S. Cl. ................................ 355/67; 355/56; 355/47; 355/44; 355/35; 101/453; 101/455; 101/456; 101/463.1
[58] Field of Search .................... 355/67, 56, 47, 355/44, 35; 430/949, 302; 101/453, 455, 456, 463.1

[56] References Cited

U.S. PATENT DOCUMENTS

| | | |
|---|---|---|
| 3,945,318 | 3/1976 | Landsman .................. 101/467 |
| 4,054,094 | 10/1977 | Caddell et al. .................. 101/467 |
| 5,272,041 | 12/1993 | Van Rompuy .................. 430/264 |
| 5,340,690 | 8/1994 | De Keyzer et al. .................. 430/204 |
| 5,345,870 | 9/1994 | Bailey et al. .................. 101/463.1 |
| 5,351,617 | 10/1994 | Williams et al. .................. 101/467 |
| 5,354,633 | 10/1994 | Lewis .................. 430/5 |

*Primary Examiner*—R. L. Moses
*Assistant Examiner*—Shival Virmani
*Attorney, Agent, or Firm*—Julie A. Krolikowski

[57] ABSTRACT

An apparatus for making a lithographic printing plate according to the silver salt diffusion transfer process image-wise exposes an imaging element with a high intensity short time scanning exposure. The imaging element comprises on a support in the order given a silver halide emulsion layer and a layer containing physical development nuclei. A thus obtained image-wise exposed imaging element is subsequently developed in the presence of a developing agent and silver halide solvent. The image-wise exposure is focused substantially within the silver halide emulsion layer of the imaging element.

23 Claims, 4 Drawing Sheets

METHOD AND APPARATUS FOR OBTAINING A LITHOGRAPHIC PLATE

This application is a divisional of application Ser. No. 08/373,664 filed Jan. 17, 1995, U.S. Pat. No. 5,616,445.

BACKGROUND OF THE INVENTION

The present invention relates to a method for obtaining a lithographic printing plate according to the silver complex diffusion transfer process by subjecting an imaging element to a high intensity short time scanning exposure, in particular an exposure by means of a laser or LED.

The principles of the silver complex diffusion transfer reversal process, hereinafter called DTR-process, have been described e.g. in U.S. Pat. No. 2,352,014 and the book "Photographic Silver Halide Diffusion Processes" by Andre Rott and Edith Weyde—The Focal Press—London and New York, (1972).

According to the DTR process, a silver complex salt is image-wise transferred by diffusion from the image-wise exposed silver halide emulsion layer into the image receiving layer, where it is converted to a silver image usually in the presence of physical development nuclei. For this purpose, the image-wise exposed silver halide emulsion layer is developed in the presence of a developing agent and non-developed silver halide is converted by means of a silver halide complexing agent into a soluble silver complex salt while in contact with an image receiving layer.

A DTR-image bearing material can be used as a planographic printing plate wherein the DTR-silver image areas form the water-repellent ink-receptive areas on a water-receptive ink-repellent surface. The DTR-image can be formed in the image-receiving layer of a sheet or web material which is a separate element with respect to the photographic silver halide emulsion material (a so-called two-sheet DTR element) disclosed in e.g. DE-A-2.346.378 or in the image-receiving layer of a so-called single-support-element, also called mono-sheet element, which contains at least one photographic silver halide emulsion layer integral with an image-receiving layer in water permeable relationship therewith. It is the latter mono-sheet version which is preferred for the preparation of offset printing plates by the DTR method.

Typically a mono-sheet DTR material comprises on one side of the support a silver halide emulsion layer and a surface layer of physical development nuclei and on the side of the support opposite to the side of the support containing the silver halide emulsion layer one or more backing layers. Typical supports used for such commercial mono-sheet DTR materials are paper or polyester film. The mono-sheet DTR-materials are available in different thicknesses so that one can select a particular material in accordance with the particular demands for the printing job.

In order to prepare a printing plate from such a monosheet DTR material, the material can be image-wise exposed by means of a contact exposure or camera-exposure. However, according to more recent developments, the mono-sheet DTR material can be subjected to a high intensity short time scanning exposure such as e.g. a laser or LED exposure. This latter method offers the advantage that full pages including text and images can be composed on a computer which can then send the digital page information to a so-called image-setter including e.g. a laser to expose the monosheet DTR material.

Image-setters are well-known devices in the graphics arts field and are commonly used to expose phototypesetting materials such as photographic films which are subsequently used in a contact exposure for making a printing plate from low sensitive photopolymer plates or diazo plates.

When using such image-setters for making a printing plate from a mono-sheet DTR material, it was observed in a number of instances that the tone reproduction on the paper copies varied from one plate thickness to another and changed more within the same printing run from one plate to another. This effect was more pronounced when using high screen rulings or when using frequency modulation screening techniques for screening a continuous tone original.

SUMMARY OF THE INVENTION

It is an object of the present invention to provide an method and apparatus for making a lithographic printing plate according to the silver salt diffusion transfer process with a high intensity short time scanning exposure and wherein the obtained printing plates have improved lithographic properties such as e.g. good ink acceptance, high printing endurance and no or little scumming (i.e. ink acceptance at the non-image areas).

Further objects will become apparent from the description hereinafter.

According to the present invention there is provided an apparatus for making a lithographic printing plate according to the silver salt diffusion transfer process comprising the steps of: image-wise exposing by means of a high intensity short time scanning exposure an imaging element comprising on a support in the order given a silver halide emulsion layer and a layer containing physical development nuclei and subsequently developing a thus obtained image-wise exposed imaging element in the presence of a developing agent and silver halide solvent characterized in that the image-wise exposure is focused substantially within the silver halide emulsion layer.

BRIEF DESCRIPTION OF THE DRAWINGS

The features and objects of the invention will become apparent in the following description taken with the accompanying drawings, in which.

DETAILED DESCRIPTION OF THE INVENTION

According to a preferred embodiment of the present invention, the image-wise exposure is carried out by means of an image-setter including a laser or LED. According to the most preferred embodiment of the present invention, an imagesetter is used having an adjustable focusing device for focusing the image-wise exposure substantially within said silver halide emulsion layer.

Figure 1:
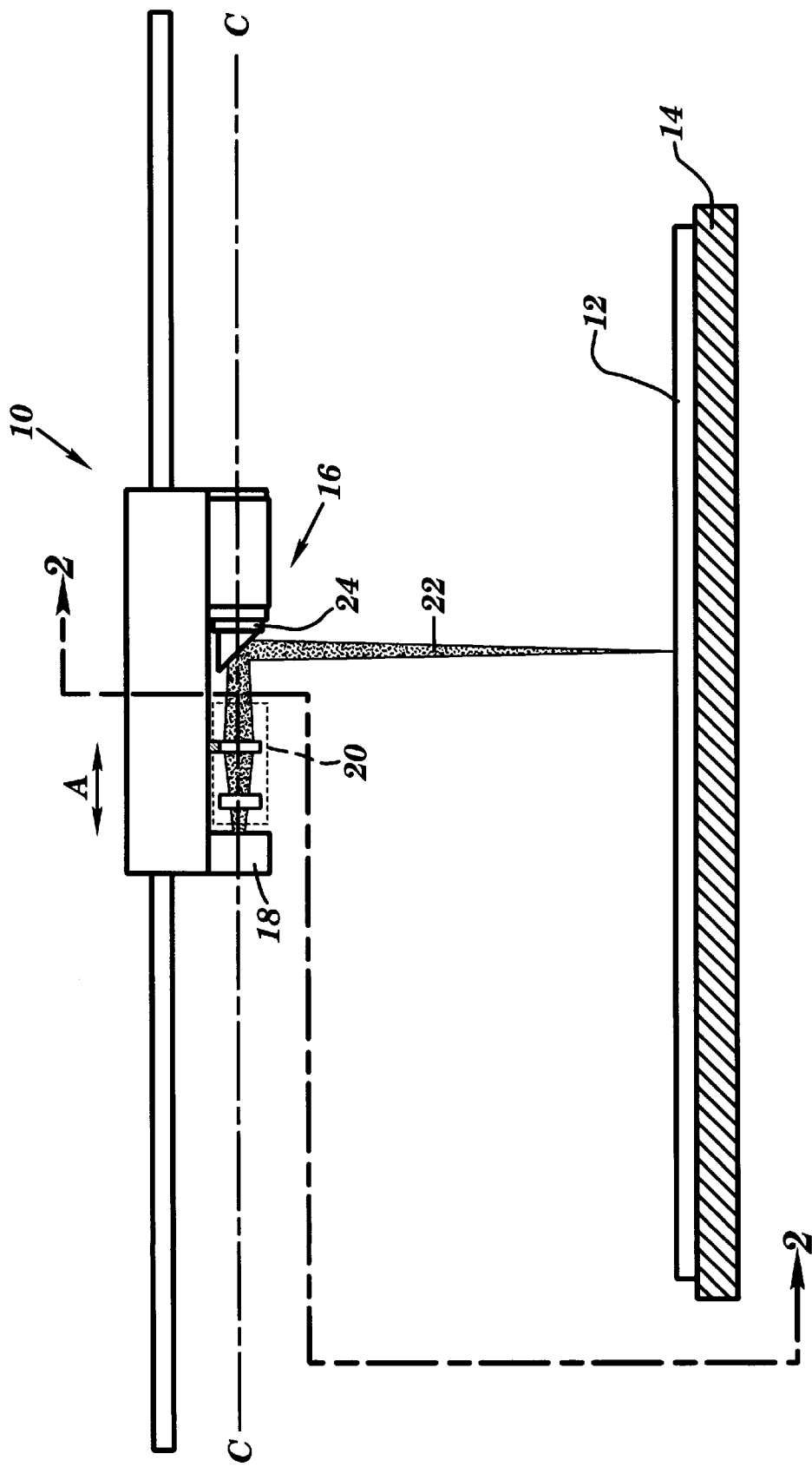
FIG. 1 is a side view of an imagesetter having a scanning exposure system according to the present invention.
Figure 2:
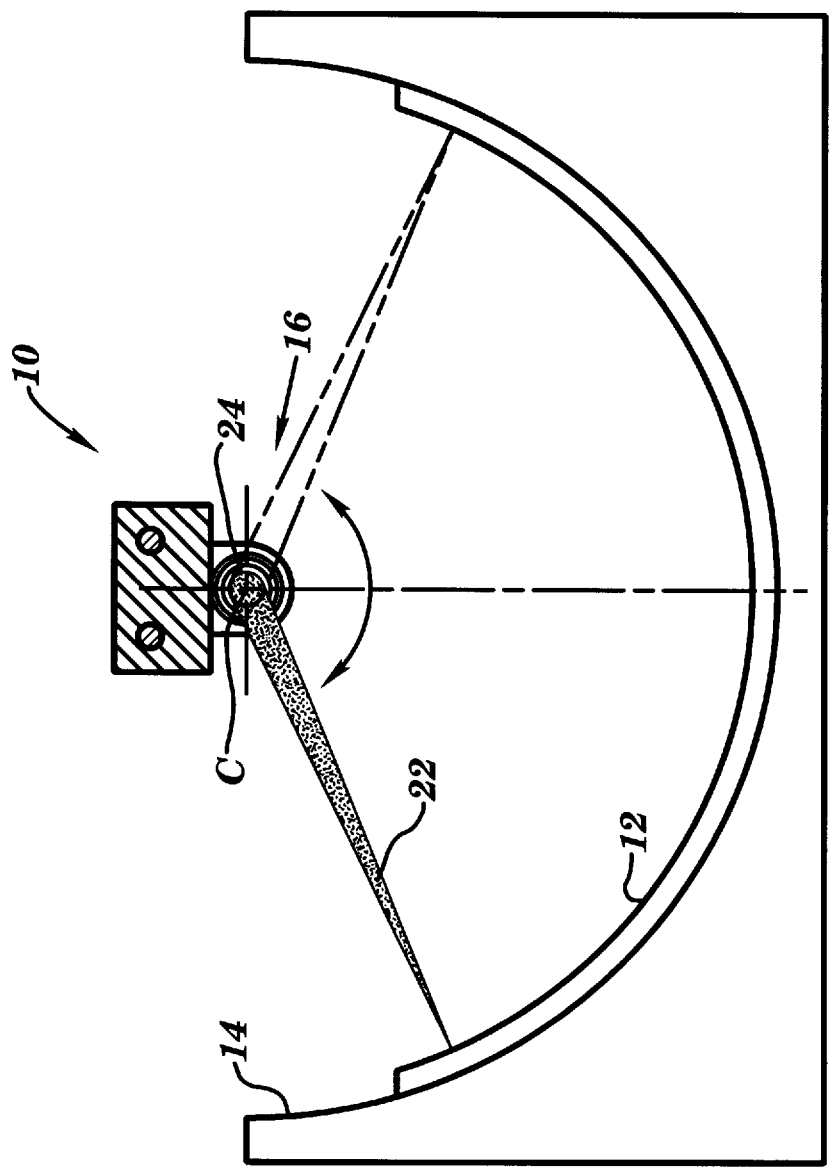
FIG. 2 is a partial sectional view of the imagesetter of FIG. 1 taken along line II—II.

Referring to FIGS. 1 and 2, an imagesetter generally indicated by 10, supports a mono-sheet DTR material 12 on a support surface 14 such as a flat platen, a capstan roller, or a cylindrical drum platen typical of known imagesetting devices. A scanning exposure system, generally indicated as 16, for high intensity, short time scanning, line-wise exposure of the material, comprises a laser beam source 18 mounted a fixed distance away from the support surface 14, an optical system 20 or 42 located in between the laser beam source 18 and the support surface 14 for focusing a laser beam 22 emitted by the laser beam source 18 or an image of the laser beam source 18 onto the material 12, and a beam deflecting apparatus 24 for line-wise scanning the laser beam 22 across the material 12 supported by the support surface 14. Relative motion between the scanning exposure system 16 and the material 12 is facilitated by mechanical means which are synchronized by electronic controls to line-wise scan the image data to be exposed onto the material on the support surface 14. In a capstan type imagesetter, such mechanical means typically comprise roller mechanisms to transport material relative to the support surface during scanning. In the drum type imagesetter 10 depicted in FIGS. 1 and 2, the scanning exposure system 16 is moved along the axis C—C of the drum 14 by a linear drive mechanism while the material 12 remains motionless.

Figure 4:
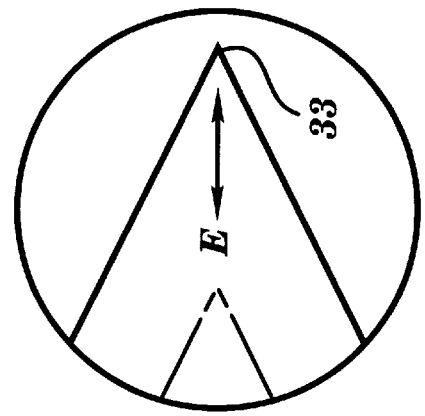
FIG. 4 is an expanded view of the beam position shown in FIG. 3.
Figure 3:
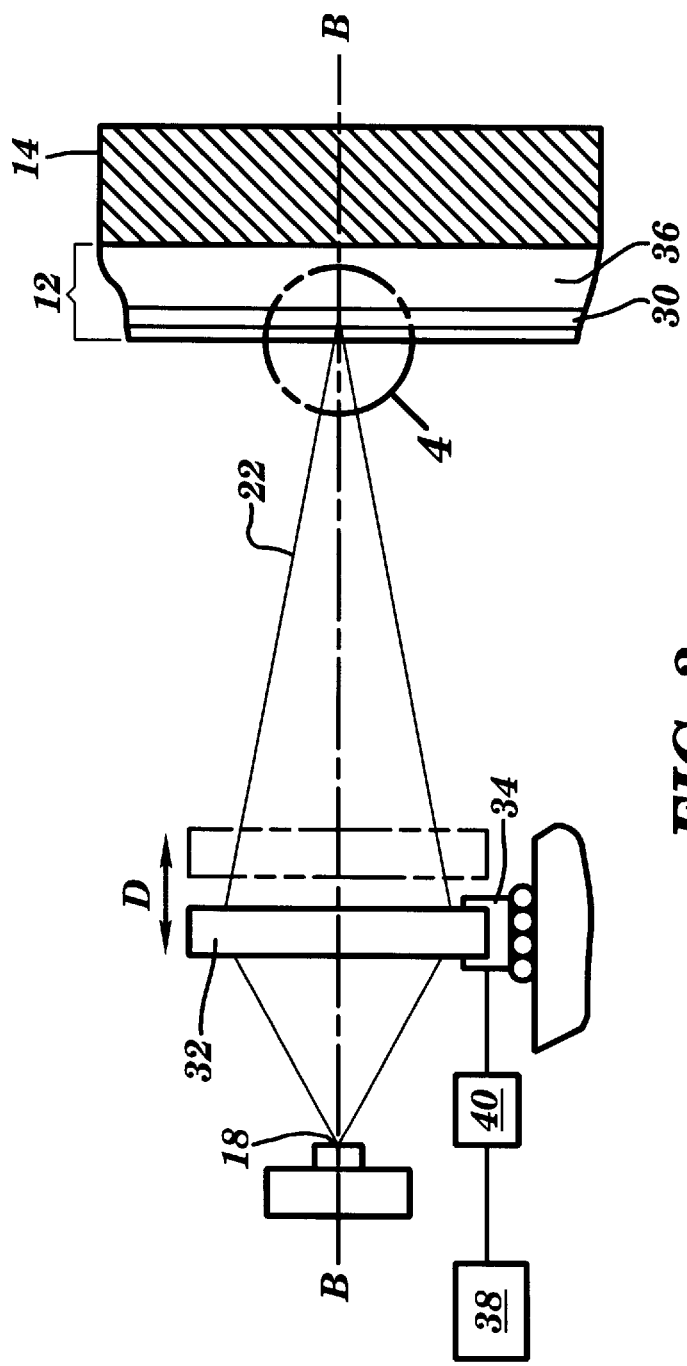
FIG. 3 is a diagrammatic view of a scanning exposure system of an imagesetter with a coarse focusing system according to a first embodiment of the present invention.

In a first embodiment shown in FIGS. 3 and 4, the optical system 20 located between the laser beam source 18 and the support surface 14 has a focusing system to position the image 33 of the laser beam source 18 at the image receiving plane 30 (hereinafter focus the beam), ideally in the emulsion layer of the material. Coarse adjustment in focus of the optical system or position of the image of the laser source can be used for different thicknesses of material, such as 4 mils, 8 mils, 12 mils, etc. The optical system comprises a lens 32 in the laser beam 22 that is adjustable longitudinally along the optical axis B—B with respect to the support surface 14, as indicated by arrow D. An adjustment mechanism 34 is used to translate the lens 32 longitudinally along the optical axis B—B with respect to the support surface 14 in order to focus the laser beam 22 or position the image 33 of the laser beam source 18 in the emulsion layer 30 of the material 12. For a lens magnification ratio greater than 1.4 to 1, the longitudinal displacements D of the lens 32 usually result in approximately equal or greater longitudinal displacements of the laser beam source image 33 at the image plane 30 indicated by an arrow E in the detail view of the laser beam source image 33 at the material surface. Therefore, a relatively precise adjustment mechanism 34 is normally required for positioning the lens 32 and coarse focusing of the beam 22 in the emulsion layer 30.

For different thicknesses of material 12, the location of the emulsion layer 30 relative to the support surface 14 changes, due to the varying thickness of the backing or support layer 36 in the material. Therefore, the optical system 20 can be calibrated experimentally and/or by a method of calculations with the precision adjustment mechanism 34 to focus the beam within the emulsion layer 30 for various thicknesses of the material 12. Once the optical system 20 has been calibrated, an operator can select the lens 32 position from an operator control panel (OCP) 38. For example, the operator using a 4 mil thickness material, selects the lens position by entering the material thickness in the OCP 38. A controller 40 which stores in memory the calibrated positions of the lens 32 according to the material thickness, then signals the precision adjustment mechanism 34 to adjust the lens 32 longitudinally along the optical axis B—B according to the position stored for a 4 mil thick material. As a result the beam 22 is focused in the emulsion layer 30 of the 4 mils thick material.

It will be understood by those skilled in the art that other optical elements (mirror, holographic, diffractive, gradient index, etc.) can be combined with the first lens for focusing the laser beam onto the material. Further the optical element or elements may be located before or after the beam deflecting apparatus. It will be appreciated that a variety of mechanisms can be used for the precision adjustment mechanism.

Figure 6:
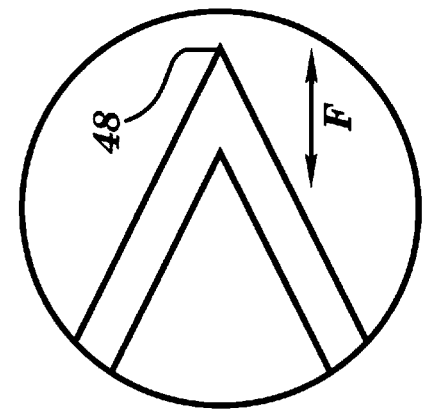
FIG. 6 is an expanded view of the beam position of FIG. 5.
Figure 5:
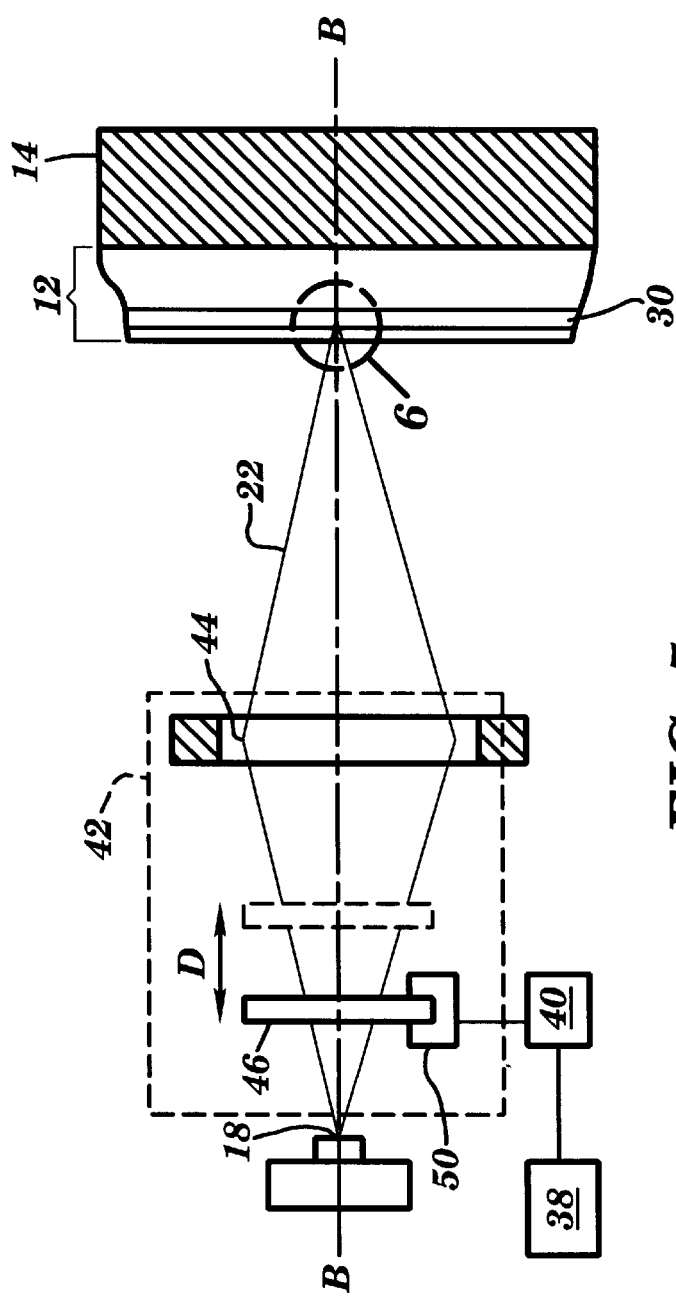
FIG. 5 is a diagrammatic view of a scanning exposure system of an imagesetter with a fine focusing system according to a second embodiment of the present invention.

In a second embodiment shown in FIGS. 5 and 6 the optical system 42 located between the laser beam source 18 and the support surface 14 has a fine focusing system to provide beam focus at the image receiving plane 30 or emulsion layer of the material by precise adjustment of the image 48 of the laser beam source 18. Precise focus adjustments can be useful to optimize focus during calibration of an optical system, for re-focus for different material thicknesses, and for reducing sources of banding artifacts in the final output image which are sensitive to focus conditions. The optical system 42 has a first lens 44 that is in the laser beam 22 and is fixed in position relative to the laser 18 and to the support surface 14. A second lens 46 is also in the laser beam 22 and is adjustable longitudinally along the optical axis B—B with respect to the first lens 44. The second lens 46 is a weak lens of long focal length relative to the first lens 44. The weak lens 46 can be a positive lens or a negative lens and can be positioned in the beam before, after, or internally to the first lens 44. Because of the relatively long focal length of the second lens 46, substantial displacements of the second lens 46 along the optical axis B—B effect relatively small changes in the focal point 48 of the first and second lenses combined, or of the entire focal optical system 42. Longitudinal displacement of the weak lens 46 along the beam path produces a significantly smaller longitudinal displacement of the laser beam source image or focused beam or focused beam position 48 at the image surface 30. In comparing the detailed view of the beam position in FIG. 4 with the exploded view of the beam position in FIG. 6, the displacement of the image 48 indicated by arrow F due to the adjustment of the weak lens 46 position is much smaller than the displacement of the image indicated by arrow E for approximately equal longitudinal adjustments D by the respective fine and coarse focusing systems.

Accordingly, an inexpensive and simple coarse adjustment mechanism 50 can be used to facilitate the displacement of the second lens 46 within the optical system 44. Due to the long focal length of the weak lens 46 the effects of any lateral displacement of the weak lens 46, generally perpendicular to the optical axis B—B, are negligible for the optical system. Therefore, a less precise drive mechanism 50 is required for positioning the weak lens without tight lateral constraints for the lens position. Both the weak lens 46 and the coarse adjustment mechanism 50 are inexpensive, lowering the cost of the focusing system of an imagesetter and enabling easy and low cost adjustments in manufacturing.

As for the coarse focus system described in the first embodiment of the invention, the fine focusing system is readily controlled by an operator. The operator controls the focus lens 46 position from the operator control panel (OCP) 38 and selects the focus lens position by entering the material thickness at the OCP 38. The controller 40 signals the coarse adjustment mechanism 50 to adjust the focus lens position longitudinally along the beam axis.

It will be understood by those skilled in the art that other optical elements (mirror, holographic, diffractive, gradient index, etc.) can be combined with the second lens to be adjustable relative to the fixed elements, provided that the combination of the adjustable optical elements has a combined focus length that is comparatively longer than the combined focal length of the fixed optical elements. It will be appreciated that a variety of mechanisms can be used to displace the weak lens with respect to the first lens without departing from the spirit of the invention.

The present invention has been proven to be particularly effective when frequency modulation screening is used for screening a continuous tone original to be reproduced on the printing plate. More in particular, a substantial improvement was found when frequency modulation screening was carried out and recording the screened data on the imaging element using a dot size of 21 μm or less.

When using a conventional amplitude modulation screening, effects of the invention were seen when using screen rulings of 60 lines per cm or more.

The imaging element for use in connection with the present invention comprises on a support in the order given at least a silver halide emulsion layer and a layer containing physical development nuclei.

The photographic silver halide emulsion suitable for use in accordance with the invention can be prepared from soluble silver salts and soluble halides according to different methods as described e.g. by P. Glafkides in "Chimie et Physique Photographique", Paul Montel, Paris (1967), by G. F. Duffin in "Photographic Emulsion Chemistry", The Focal Press, London (1966), and by V. L. Zelikman et al in "Making and Coating Photographic Emulsion", The Focal Press, London (1966).

The photographic silver halide emulsions used according to the present invention can be prepared by mixing the halide and silver solutions in partially or fully controlled conditions of temperature, concentrations, sequence of addition, and rates of addition. The silver halide can be precipitated according to the single-jet method or the double-jet method which are well-known by those skilled in the art.

The silver halide particles of the photographic emulsions used according to the present invention may have a regular crystalline form such as a cubic or octahedral form or they may have a transition form. They may also have an irregular crystalline form such as a spherical form or a tabular form, or may otherwise have a composite crystal form comprising a mixture of said regular and irregular crystalline forms.

According to the present invention the emulsion or emulsions preferably consist principally of silver chloride while a fraction of silver bromide is present ranging from 1 mole % to 40 mole %. The emulsions preferably belong to the core/shell type well known to those skilled in the art in the sense that substantially all the bromide is concentrated in the core. This core contains preferably 10 to 40% of the total silver halide precipitated, while the shell consists preferably of 60 to 90% of the total silver halide precipitated.

The average size of the silver halide grains may range from 0.10 to 0.70 μm, preferably from 0.25 to 0.45 μm.

The size distribution of the silver halide particles of the photographic emulsions to be used according to the present invention can be homodisperse or heterodisperse. A homodisperse size distribution is obtained when 95% of the grains have a size that does not deviate more than 30% from the average grain size.

Preferably during the precipitation stage Iridium and/or Rhodium containing compounds or a mixture of both are added. The concentration of these added compounds ranges from $10^{-8}$ to $10^{-3}$ mole per mole of $AgNO_3$, preferably between $10^{-7}$ and $10^{-6}$ mole per mole of $AgNO_3$. This results in the building in the silver halide crystal lattice of minor amounts of Iridium and/or Rhodium, so-called Iridium and/or Rhodium dopants. As known to those skilled in the art numerous scientific and patent publications disclose the addition of Iridium or Rhodium containing compounds or compounds containing other elements of Group VIII of the Periodic System during emulsion preparation.

The emulsions can be chemically sensitized e.g. by adding sulphur-containing compounds during the chemical ripening stage e.g. allyl isothiocyanate, allyl thiourea, and sodium thiosulphate. Also reducing agents e.g. the tin compounds described in BE-P 493,464 and 568,687, and polyamines such as diethylene triamine or derivatives of aminomethane-sulphonic acid can be used as chemical sensitizers. Other suitable chemical sensitizers are noble metals and noble metal compounds such as gold, platinum, palladium, iridium, ruthenium and rhodium. This method of chemical sensitization has been described in the article of R. KOSLOWSKY, Z. Wiss. Photogr. Photophys. Photochem. 46, 65–72 (1951).

The emulsions of the DTR element can be spectrally sensitized according to the spectral emission of the exposure source for which the DTR element is designed.

Suitable sensitizing dyes for the visible spectral region include methane dyes such as those described by F. M. Hamer in "The Cyanine Dyes and Related Compounds", 1964, John Wiley & Sons. Dyes that can be used for this purpose include cyanine dyes, merocyanine dyes, complex cyanine dyes, complex merocyanine dyes, homopolar cyanine dyes, hemicyanine dyes, styryl dyes and hemioxonol dyes. Particularly valuable dyes are those belonging to the cyanine dyes, merocyanine dyes, complex merocyanine dyes.

The silver halide emulsions may contain the usual stabilizers e.g. homopolar or salt-like compounds of mercury with aromatic or heterocyclic rings such as mercaptotriazoles, simple mercury salts, sulphonium mercury double salts and other mercury compounds. Other suitable stabilizers are azaindenes, preferably tetra- or penta-azaindenes, especially those substituted with hydroxy or amino groups. Compounds of this kind have been described by BIRR in Z. Wiss. Photogr. Photophys. Photochem. 47, 2–27 (1952). Other suitable stabilizers are i.a. heterocyclic mercapto compounds e.g. phenylmercaptotetrazole, quaternary benzothiazole derivatives, and benzotriazole. Preferred compounds are mercapto substituted pyrimidine derivatives as disclosed in U.S. Pat. No. 3,692,527.

The layer containing physical development nuclei is preferably free of hydrophilic binder but may comprise small amounts up to 30% by weight of the total weight of said layer of a hydrophilic colloid e.g. polyvinyl alcohol to improve the hydrophilicity of the surface. Preferred development nuclei for use in accordance with the present invention are sulphides of heavy metals e.g. sulphides of antimony, bismuth, cadmium, cobalt, lead, nickel, palladium, platinum, silver, and zinc. Especially suitable development nuclei in connection with the present invention are palladium sulphide nuclei. Other suitable development nuclei are salts such as e.g. selenides, polyselenides, polysulphides, mercaptans, and tin (II) halides. Heavy metals, preferably silver, gold, platinum, palladium, and mercury can be used in colloidal form.

In addition to the above described emulsion layer and layer containing physical development nuclei other hydrophilic colloid layers in water permeable relationship with these layers may be present. For example additional silver halide emulsion layers may be present as disclosed in U.S. Pat. No. 4,772,535, an intermediate hydrophilic colloid layer may be provided between the photosensitive silver halide emulsion layer and the surface layer containing physical development nuclei, etc.. It is especially advantageous to include a base-layer between the support and the photosensitive silver halide emulsion layer. In a preferred embodiment of the present invention said base-layer serves as an antihalation layer. This layer can therefore contain the same light-absorbing dyes as described above for the emulsion layer; as alternative finely divided carbon black can be used for the same antihalation purposes as described in U.S. Pat. No. 2,327,828. On the other hand, in order to gain sensitivity, light reflecting pigments, e.g. titaniumdioxide can be present. Further this layer can contain hardening agents, matting agents, e.g. silica particles, and wetting agents. At least part of these matting agents and/or light reflection pigments may also be present in the silver halide emulsion layer the most part however preferably being present in said base-layer. As a further alternative the light reflecting pigments may be present in a separate layer provided between the antihalation layer and the photosensitive silver halide emulsion layer.

The hydrophilic layers on the photosensitive side of the support usually contain gelatin as hydrophilic colloid binder. Mixtures of different gelatins with different viscosities can be used to adjust the rheological properties of the layer.

The hydrophilic layers of the photographic element, especially when the binder used is gelatin, can be hardened with appropriate hardening agents such as those of the epoxide type, those of the ethylenimine type, those of the vinylsulfone type e.g. 1,3-vinylsulphonyl-2-propanol, chromium salts e.g. chromium acetate and chromium alum, aldehydes e.g. formaldehyde, glyoxal, and glutaraldehyde, N-methylol compounds e.g. dimethylolurea and methyloldimethylhydantoin, dioxan derivatives e.g. 2,3-dihydroxy-dioxan, active vinyl compounds e.g. 1,3,5-triacryloyl-hexahydro-s-triazine, active halogen compounds e.g. 2,4-dichloro-6-hydroxy-s-triazine, and mucohalogenic acids e.g. mucochloric acid and mucophenoxychloric acid. These hardeners can be used alone or in combination. The binders can also be hardened with fast-reacting hardeners such as carbamoylpyridinium salts of the type, described in U.S. Pat. No. 4,063,952.

Preferably used hardening agents are of the aldehyde type. The hardening agents can be used in wide concentration range but are preferably used in an amount of 4% to 7% of the hydrophilic colloid. Different amounts of hardener can be used in the different layers of the mono-sheet DTR material or the hardening of one layer may be adjusted by the diffusion of a hardener from another layer.

Supports suitable for use in accordance with the present invention may be opaque or transparent, e.g. a paper support or resin support. When a paper support is used preference is given to one coated at one or both sides with an Alpha-olefin polymer, e.g. a polyethylene layer which optionally contains an anti-halation dye or pigment. It is also possible to use an organic resin support e.g. cellulose nitrate film, cellulose acetate film, poly(vinyl acetal) film, polystyrene film, poly (ethylene terephthalate) film, polycarbonate film, polyvinylchloride film or poly-Alpha-olefin films such as polyethylene or polypropylene film. The thickness of such organic resin film is preferably comprised between 0.07 and 0.35 mm. These organic resin supports are preferably coated with a hydrophilic adhesion layer which can contain water insoluble particles such as silica or titanium dioxide.

According to the method of the present invention the above described imaging element is image-wise exposed and subsequently developed according to the DTR-process in the presence of a silver halide solvent and developing agent.

Silver halide developing agents for use in accordance with the present invention are preferably of the p-dihydroxybenzene type, e.g. hydroquinone, methylhydroquinone or chlorohydroquinone, preferably in combination with an auxiliary developing agent being a 1-phenyl-3-pyrazolidinone-type developing agent and/or p-monomethylaminophenol. Particularly useful auxiliary developing agents are of the phenidone type e.g. 1-phenyl-3-pyrazolidinone, 1-phenyl-4-monomethyl-3-pyrazolidinone, and 1-phenyl-4,4-dimethyl-3-pyrazolidinone. However other developing agents can be used. Said developing agents may be contained in an alkaline processing liquid but are preferably contained in one or more layers of the imaging element. In the latter case the alkaline processing liquid merely serves as an alkaline activating liquid.

The pH of said activating liquid is preferably between 12 and 14 and may be established by an organic and/or inorganic alkali agent. Examples of suitable alkali agents are e.g. sodium hydroxide, carbonates, secundary and/or tertiary alkanolamines, amines etc. or mixtures thereof.

It is furthermore essential that the DTR-process is carried out in the presence of (a) silver halide solvent(s). Said silver halide solvent(s) can be present in one or more layers comprised in the imaging element but are preferably comprised in the alkaline processing liquid. Suitable silver halide solvents for use in accordance with the present invention are e.g. thiosulphate or thiocyanate. Further interesting silver halide complexing agents, are cyclic imides, preferably combined with alkanolamines, as described in U.S. Pat. Nos. 4,297,430 and 4,355,090 and 2-mercaptobenzoic acid derivatives as described in U.S. Pat. No. 4,297,429, preferably combined with alkanolamines or with cyclic imides and alkanolamines.

The alkaline processing liquid preferably also contains a preserving agent having antioxidation activity, e.g. sulphite ions provided e.g. by sodium or potassium sulphite. For example, the aqueous alkaline solution comprises sodium sulphite in an amount ranging from 0.15 to 1.0 mol/l. Further may be present a thickening agent, e.g. hydroxyethylcellulose and carboxymethylcellulose, fog inhibiting agents, e.g. potassium bromide, potassium iodide and a benzotriazole which is known to improve the printing endurance, calcium-sequestering compounds, anti-sludge agents, and hardeners including latent hardeners.

The alkaline processing liquid can contain one or more hydrophobizing agents to enhance the ink-receptive properties of the DTR silver image, e.g. those described in U.S. Pat. Nos. 3,776,728, and 4,563,410. Preferred compounds are 5-nheptyl-2-mercapto-1,3,4,-oxadiazol and 3-mercapto-4-acetamido-5-n.heptyl-1,2,4-triazole.

The development and diffusion transfer can be initiated in different ways e.g. by rubbing with a roller that has been wetted with the processing liquid, e.g. acts as meniscus coater, by wiping with an absorbent means e.g. with a plug of cotton or sponge, or by dipping the material to be treated in the liquid composition. Preferably, they proceed in an automatically operated apparatus such as RAPILINE SP 430, marketed by AGFA. The DTR-process is normally carried out at a temperature in the range of 10° C. to 35° C. In order to minimize the quality loss due to bath exhaustion, regenerating liquids can be added in proportion to the consumption of processing liquids. Preferably the DTR material is subsequently guided through a neutralization solution. In order to reduce the pH of the wet swollen DTR element leaving the alkaline processing solution, the neutralization liquid contains buffer ions, e.g. phosphate buffer or citrate buffer to establish in said liquid a pH value ranging from 5.0 to 7.0. The neutralization solution can further contain bactericides, e.g. phenol, thymol or 5-bromo-5-nitro-1,3-dioxan as described in EP 0,150,517. The liquid can also contain substances which influence the hydrophobic/hydrophilic balance of the printing plate obtained after processing of the DTR element, e.g. silica. Finally the neutralization solution can contain wetting agents, preferably compounds containing perfluorinated alkyl groups.

The present invention will now be illustrated by the following example without however limiting it thereto. All parts are by weight unless otherwise specified.

EXAMPLE

A commercially available imaging element, Setprint HN LL 20 (available from Agfa-Gevaert NV, Belgium), which comprises on a polyester film support having a thickness of 0.175 mm in the order given an anti-halation layer, silver halide emulsion layer and physical development nuclei layer was image-wise exposed by means of a He/Ne laser using an image setter (SelectSet Avantra 25, commercially available from Miles Inc., USA). The imaging element, that also included a developing agent, was subsequently processed in an automatic processing machine using as an alkaline activating liquid G260b and as a neutralizing liquid G360b (both commercially available from Agfa-Gevaert NV, Belgium). The activating liquid contained KSCN as a silver halide solvent.

The image-wise exposure was carried out without adjusting the focus substantially within the emulsion layer and using the screened data of a continuous tone original (amplitude modulation screened with a screen ruling of 60 lines per cm). The thus obtained printing plate was given sample number 1.

Printing plate sample number 2 was obtained similar to printing plate sample number 1 but with the modification that the image-wise exposure was adjusted substantially within the silver halide emulsion layer.

Printing plate sample number 3 was obtained similar to printing plate sample number 1 but with the modification that the screened data was obtained with a frequency modulation screening technique (CrystalRaster, commercially available from Miles Inc., USA). The recording resolution used was 2400 dpi (21 $\mu$m microdot size).

Printing plate sample number 4 was obtained similar to printing plate sample number 3 but with the modification that the image-wise exposure was adjusted substantially within the silver halide emulsion layer.

The four printing plates thus obtained were used to print on an offset printing machine using a commonly employed ink and a dampening liquid having the following composition:

| water | 880 ml |
|---|---|
| citric acid | 6 g |
| boric acid | 8.4 g |
| sodium sulphate anh. | 25 g |
| ethylene glycol | 100 g |
| colloidal silica | 28 g |

The tone reproduction of the original on the paper copies obtained by printing with each of the four printing plates was evaluated and a number was assigned on a scale of 1 to 5 to indicate the deviation in the tone reproduction (1 being best and 5 being worst). The printing endurance of the plates was also evaluated (the printing run was stopped when too much change in the tone reproduction with respect to the first copies was found).

| Sample number | Tone reproduction | Printing endurance (number of good copies) |
|---|---|---|
| 1 | 3 | 4000 |
| 2 | 1 | >5000 |
| 3 | 5 | 3000 |
| 4 | 1 | >5000 |

While this invention has been described in terms of various preferred embodiments, those skilled in the art will appreciate that various modifications, substitutions, omissions and changes may be made without departing from the spirit thereof. Accordingly, it is intended that the scope of the present invention be limited solely by the scope of the following claims, including equivalents thereof.

We claim:

1. An apparatus for making a lithographic printing plate according to the silver salt diffusion transfer process comprising:

means for image-wise exposing an image; and means for developing a thus obtained image-wise exposed imaging element with a developing agent and silver halide solvent;

wherein the imaging element includes, on a support in the order given, a silver halide emulsion layer and a physical development nuclei layer;

wherein said means for image-wise exposing includes means for focusing a high intensity short time scanning exposure substantially within said silver halide emulsion layer of said imaging element.

2. The apparatus according to claim 1, wherein said means for focusing the scanning exposure in said silver halide emulsion layer comprises means for adjusting the position of the scanning exposure according to the support thicknesses of the imaging element.

3. The apparatus according to claim 2, wherein the support thickness is in a range from 4 mils to 20 mils.

4. The apparatus according to claim 1, wherein said apparatus for making a lithographic printing plate comprises an internal drum imagesetter and a chemical processor.

5. The apparatus according to claim 1, wherein said means for image-wise exposing are within an internal drum imagesetter.

6. The apparatus according to claim 2, wherein said means for image-wise CD exposing further comprises a high intensity short time exposure source, a support means for supporting said imaging element during exposure, optical means for focusing the high intensity short time exposure emitted by the high intensity short time exposure source onto the imaging element, and deflecting means for image-wise scanning the high intensity short time exposure across the imaging element supported by said support means.

7. The apparatus according to claim 6, wherein said means for focusing the high intensity short time scanning exposure substantially within said silver halide emulsion layer of said imaging element comprises means for adjusting said optical means relative to said high intensity short time exposure source and said support means.

8. The apparatus according to claim 7, wherein said optical means comprises a focusing lens and a weak optical element having a long focal length relative to that of said focusing lens, and wherein said means for adjusting said optical means adjusts the position of said weak optical element relative to said focusing lens to fine focus the high intensity short time scanning exposure substantially within said silver halide emulsion layer of said imaging element.

9. The apparatus according to claim 6, wherein said means for image-wise exposing are within an internal drum imagesetter.

10. The apparatus according to claim 7, wherein said means for image-wise exposing are within an internal drum imagesetter.

11. The apparatus according to claim 8, wherein said means for image-wise exposing are within an internal drum imagesetter.

12. A system for transforming a plate having an emulsion layer formed on a surface thereof to obtain a lithographic printing plate, comprising:

an emitter configured to emit a beam of radiation; and a beam focussing assembly configured to focus the emitted beam of radiation within the emulsion layer.

13. A system according to claim 12, wherein:

the plate has a thickness; and said beam focussing assembly includes an adjustable focus element disposed in a path of the emitted beam and a controller for adjusting the focus element based upon the thickness of the plate to focus the beam of radiation.

14. A system according to claim 13, wherein the controller precisely adjusts the adjustable focus element.

15. A system according to claim 13, wherein:

said beam focussing assembly further includes a non-adjustable focus element disposed in a path of the emitted beam.

16. A system according to claim 15, wherein the controller coarsely adjusts the adjustable focus element.

17. A system according to claim 15, wherein said adjustable focus element is a weak optical element having a long focal length relative to the non-adjustable focus element.

18. A system according to claim 12, wherein:

the plate has a thickness within a range of thicknesses; and said beam focussing assembly includes a controller for adjusting the focus element based upon the thickness of the plate to focus the beam of radiation.

19. A system according to claim 18, wherein the range of thicknesses is from 4 mils to 20 mils.

20. A system according to claim 12, wherein the emulsion layer is formed of silver halide and has a physical development nuclei layer formed on a surface thereof which is opposed to a surface of the emulsion layer disposed adjacent the plate.

21. A system according to claim 12, wherein the beam focussing assembly configured includes an optical element moveable along the path of the emitted beam of radiation so as to focus the emitted beam.

22. A system according to claim 12, further comprising:

a control panel for inputting a thickness of the plate;

wherein the thickness of the plate is within a defined range of thicknesses and the beam focussing assembly focusses the emitted beam of radiation responsive to said input thickness.

23. A system according to claim 12, wherein the beam focussing assembly automatically focusses the emitted beam of radiation based upon a thickness of the plate.

\* \* \* \* \*

UNITED STATES PATENT AND TRADEMARK OFFICE
CERTIFICATE OF CORRECTION

PATENT NO. : 5,841,521
DATED : November 24, 1998
INVENTOR(S) : Kelley et al.

It is certified that error appears in the above-identified patent and that said Letters Patent is hereby corrected as shown below:

<u>In the title</u>

Delete "Method and ".

<u>Column 2</u>

In the summary, line 15, change "an method and apparatus" to --an apparatus--

Signed and Sealed this

Thirtieth Day of March, 1999

Attest:

Q. TODD DICKINSON

*Attesting Officer*   *Acting Commissioner of Patents and Trademarks*